(12) United States Patent
Brech et al.

(10) Patent No.: US 10,020,270 B2
(45) Date of Patent: Jul. 10, 2018

(54) SEMICONDUCTOR DEVICE INCLUDING A LDMOS TRANSISTOR, MONOLITHIC MICROWAVE INTEGRATED CIRCUIT AND METHOD

(71) Applicant: Infineon Technologies AG, Neubiberg (DE)

(72) Inventors: Helmut Brech, Lappersdorf (DE); Albert Birner, Regensburg (DE); Matthias Zigldrum, Regensburg (DE); Michaela Braun, Regensburg (DE); Jan Ropohl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/279,649

(22) Filed: Sep. 29, 2016

(65) Prior Publication Data

US 2018/0090455 A1    Mar. 29, 2018

(51) Int. Cl.
| | | |
|---|---|---|
| *H01L 23/66* | (2006.01) | |
| *H01L 29/78* | (2006.01) | |
| *H01L 23/48* | (2006.01) | |
| *H01L 49/02* | (2006.01) | |
| *H01L 21/768* | (2006.01) | |
| *H03F 3/193* | (2006.01) | |
| *H03F 3/21* | (2006.01) | |

(52) U.S. Cl.
CPC ........ *H01L 23/66* (2013.01); *H01L 21/76898* (2013.01); *H01L 23/481* (2013.01); *H01L 28/10* (2013.01); *H01L 28/20* (2013.01); *H01L 28/40* (2013.01); *H01L 29/7816* (2013.01); *H03F 3/193* (2013.01); *H03F 3/21* (2013.01); *H01L 2223/6616* (2013.01); *H01L 2223/6655* (2013.01); *H01L 2223/6683* (2013.01); *H03F 2200/222* (2013.01); *H03F 2200/411* (2013.01)

(58) Field of Classification Search
CPC ............. H01L 23/66; H01L 2223/6683; H01L 2223/6688; H01L 29/7816–29/7826
See application file for complete search history.

(56) References Cited

U.S. PATENT DOCUMENTS

| | | |
|---|---|---|
| 5,252,848 A | 10/1993 | Adler et al. |
| 6,048,772 A | 4/2000 | D'Anna |
| 7,119,399 B2 | 10/2006 | Ma et al. |
| 7,221,034 B2 | 5/2007 | Ma et al. |
| 7,253,492 B2 | 8/2007 | Ma et al. |
| 7,456,094 B2 | 11/2008 | Ma et al. |

(Continued)

FOREIGN PATENT DOCUMENTS

| | | |
|---|---|---|
| DE | 10348641 A1 | 5/2005 |
| EP | 3073639 A1 | 9/2016 |

OTHER PUBLICATIONS

Sunitha, et al., "Reduced Surface Field Technology for LDMOS: A Review", International Journal of Emerging Technology and Advanced Engineering, vol. 4, Issue 6, Jun. 2014, pp. 173-176.

*Primary Examiner* — Daniel Shook
(74) *Attorney, Agent, or Firm* — Murphy, Bilak & Homiller, PLLC

(57) ABSTRACT

In an embodiment, a semiconductor device includes a semiconductor substrate including a front surface, an LDMOS transistor structure in the front surface, a conductive interconnection structure arranged on the front surface, and at least one cavity arranged in the front surface.

20 Claims, 11 Drawing Sheets

(56) References Cited

U.S. PATENT DOCUMENTS

| | | |
|---|---|---|
| 7,626,233 B2 | 12/2009 | Tornblad et al. |
| 7,772,123 B2 | 8/2010 | Birner et al. |
| 8,227,340 B2 | 7/2012 | Seidel et al. |
| 8,399,936 B2 | 3/2013 | Birner et al. |
| 8,518,764 B2 | 8/2013 | Dao et al. |
| 8,680,615 B2 | 3/2014 | Mitra et al. |
| 8,890,324 B2 | 11/2014 | Dao |
| 8,897,470 B2 * | 11/2014 | Huang .................. B81C 1/0023 381/174 |
| 9,064,712 B2 | 6/2015 | Sanders et al. |
| 9,224,858 B1 | 12/2015 | Camillo-Castillo et al. |
| 2008/0304681 A1 * | 12/2008 | Langlois ................ H04R 1/222 381/174 |
| 2009/0146245 A1 | 6/2009 | Tischler |
| 2010/0140714 A1 | 6/2010 | Ren et al. |
| 2011/0062547 A1 | 3/2011 | Onishi et al. |
| 2012/0037969 A1 | 2/2012 | Sanders et al. |
| 2013/0099312 A1 | 4/2013 | Dao et al. |
| 2014/0054608 A1 | 2/2014 | Takatani et al. |
| 2014/0283618 A1 | 9/2014 | Yasumoto et al. |
| 2014/0291767 A1 | 10/2014 | Lee et al. |
| 2016/0181361 A1 | 6/2016 | Shea |

\* cited by examiner

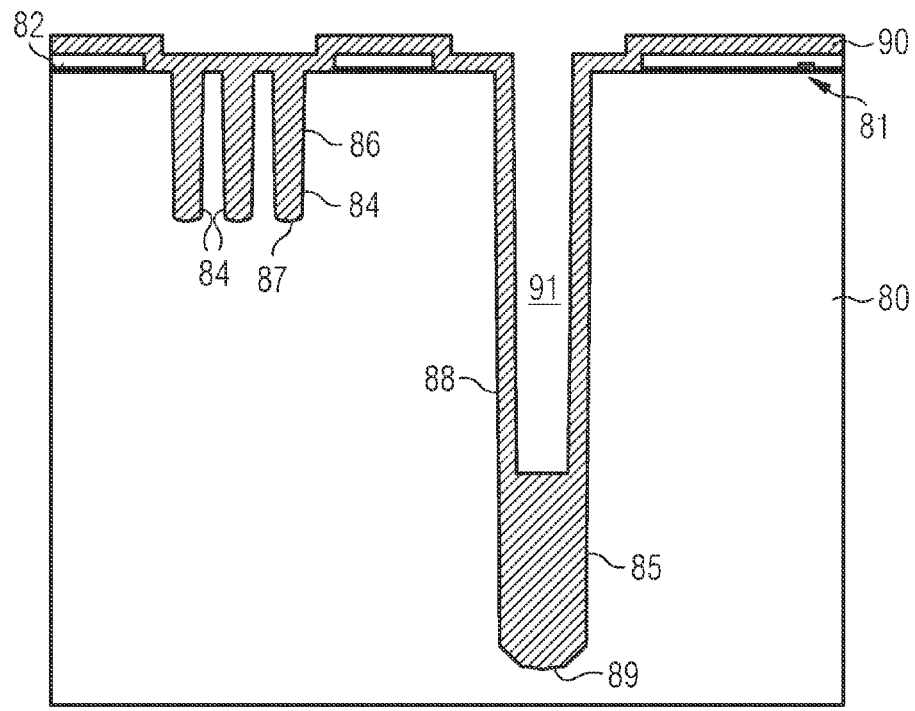
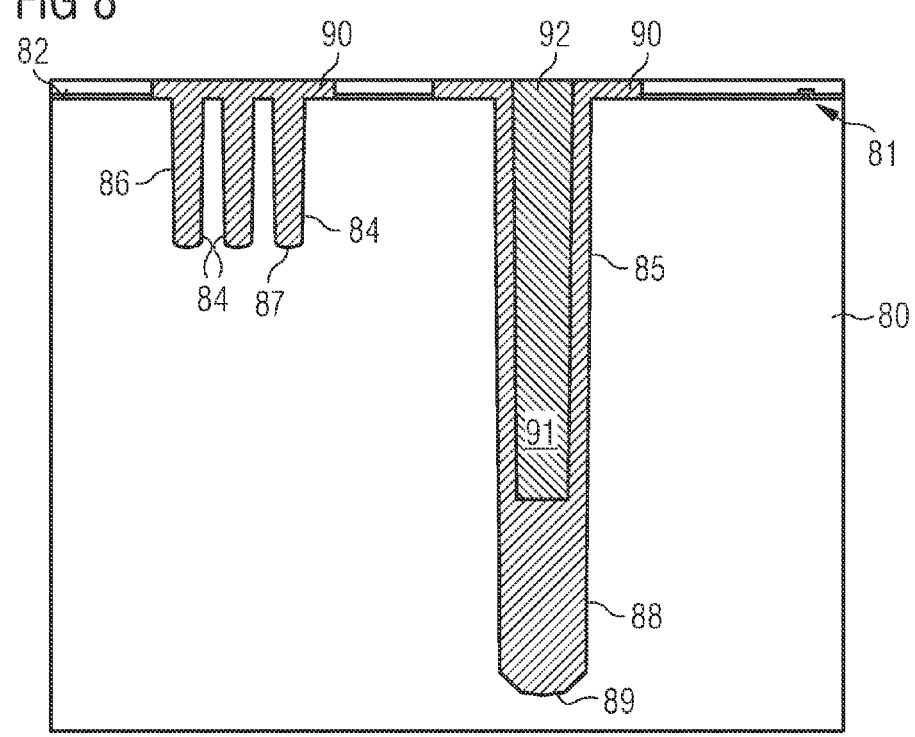

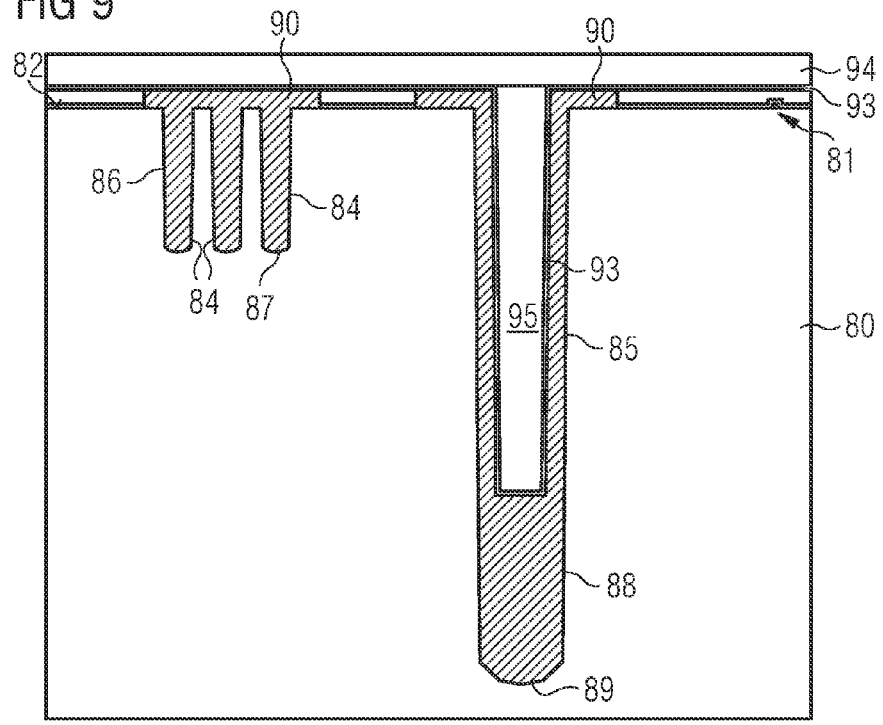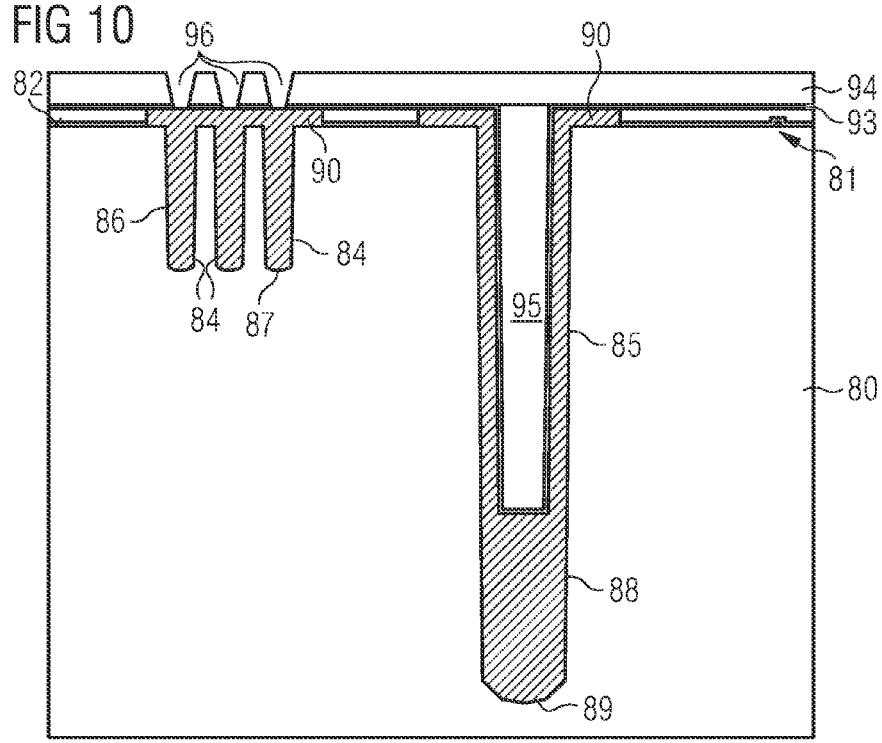

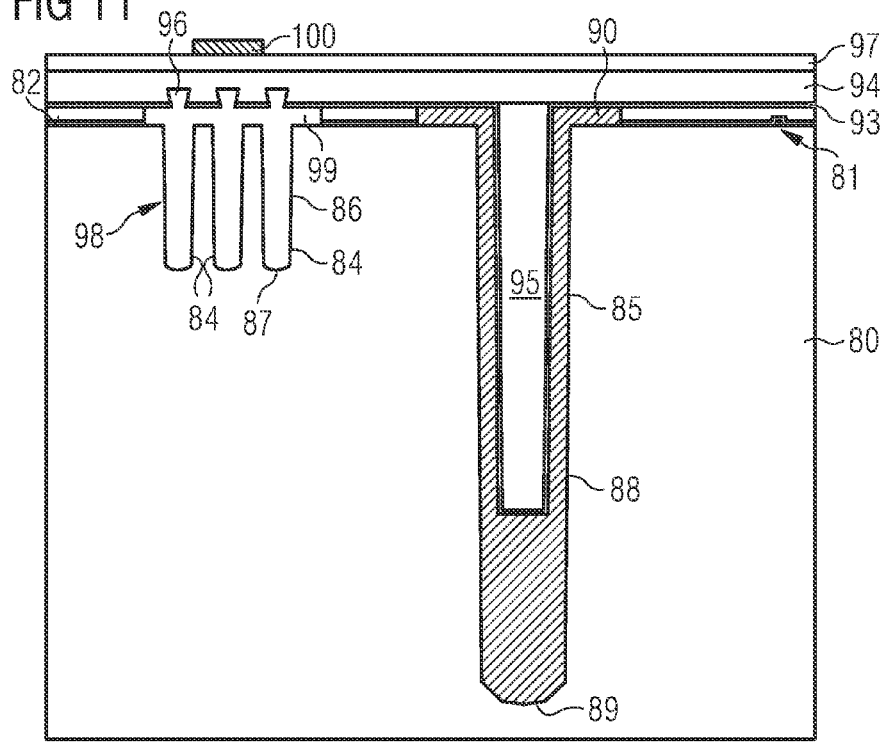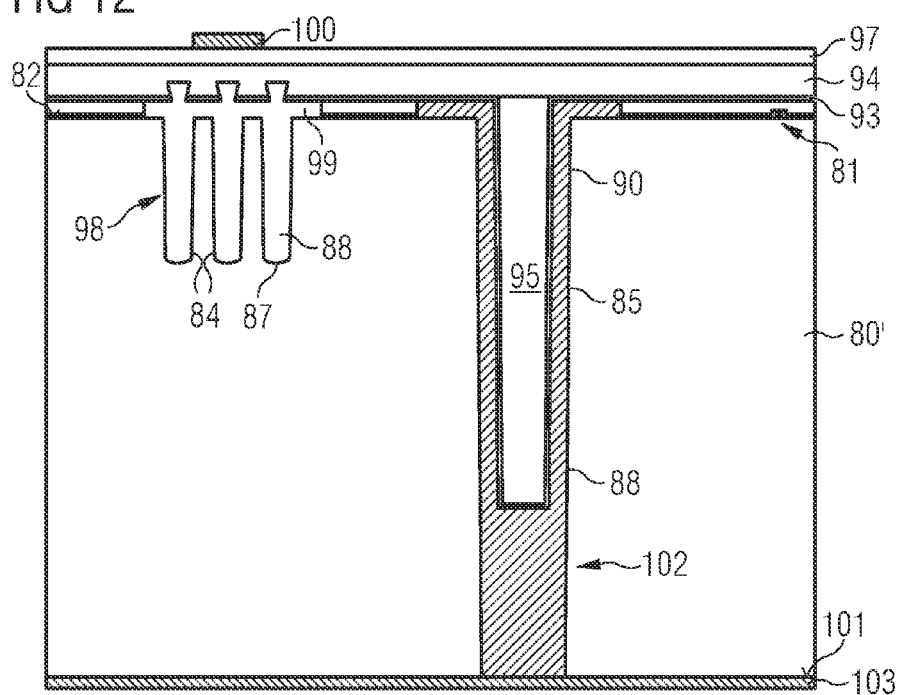

SEMICONDUCTOR DEVICE INCLUDING A LDMOS TRANSISTOR, MONOLITHIC MICROWAVE INTEGRATED CIRCUIT AND METHOD

BACKGROUND

There is an ongoing need for solid state circuits adapted to operate at higher and higher frequencies, including microwave frequencies. As used herein, the term "microwave" is intended to refer to frequencies at or above about 800 mega-Hertz. Various transistor structures have been created that are capable of providing gain in such frequency ranges. A LDMOS (Lateral Diffused Metal Oxide Semiconductor) transistor is an example of such a transistor structure.

A Monolithic Microwave Integrated Circuit (MMIC) may include a substrate with one or more arrays of LDMOS transistor structures, each array providing a stage of an amplifying circuit. The MMIC may further include passive components such as capacitors, inductors and resistors arranged on the surface of the substrate to complete the circuit. At high frequencies parasitic coupling between the components of the circuit can limit performance.

Therefore, further improvements to reduce parasitic coupling in semiconductor devices for use at higher frequencies, such as MMICs, are desirable.

SUMMARY

In an embodiment, a semiconductor device includes a semiconductor substrate comprising a front surface, an LDMOS transistor structure in the front surface, a conductive interconnection structure arranged on the front surface, and a cavity arranged in the front surface.

In an embodiment, a monolithic microwave integrated circuit includes a semiconductor substrate having a front surface, an LDMOS transistor structure in the front surface, a capacitor monolithically arranged on the front surface of the semiconductor substrate, an inductor monolithically arranged on the front surface of the semiconductor substrate, and a planar interconnection structure arranged on the front surface and coupling the LDMOS transistor device, the capacitor and the inductor so as to form the monolithic microwave integrated circuit. A cavity is arranged in the semiconductor substrate underneath at least one of the capacitor and the inductor.

In an embodiment, a method includes forming a first opening in a front surface of a semiconductor substrate including an LDMOS transistor structure, and covering the first opening with a first layer so as to form an enclosed cavity defined by material of the semiconductor substrate and the first layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 7 illustrates semiconductor substrate of FIG. 6 after the introduction of conductive material into the first and second blind vias.

FIG. 8 illustrates the semiconductor substrate of FIG. 7 after a planarization process.

FIG. 9 illustrates semiconductor substrate of FIG. 8 after the application of a first dielectric layer.

FIG. 10 illustrates the semiconductor substrate of FIG. 9 after introduction of openings in the dielectric layer above the first blind vias.

FIG. 11 illustrates the semiconductor substrate of FIG. 10 after the formation of cavities in the first blind vias.

FIG. 12 illustrates the semiconductor substrate after the formation of a passive component above the cavities.

DETAILED DESCRIPTION

Figure 1:
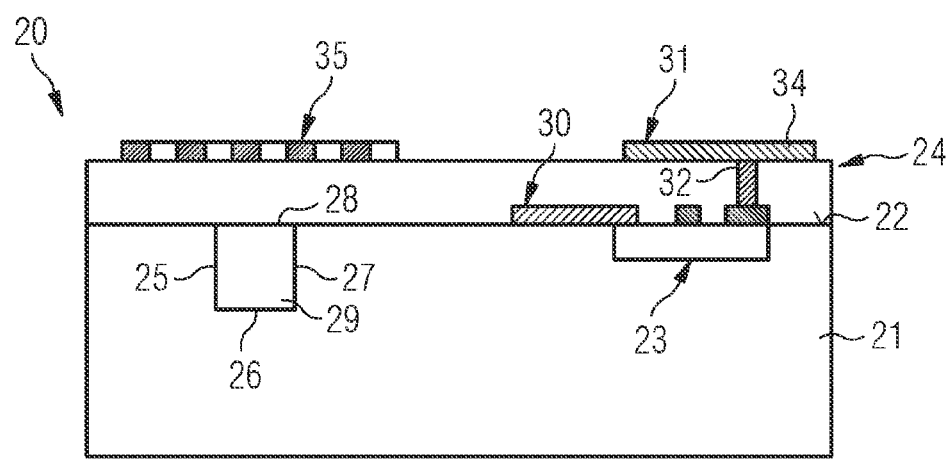
FIG. 1 illustrates a semiconductor device including a LDMOS transistor structure.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type then is either P or N type.

It will be understood by those of skill in the art that the active device(s), such as a LDMOS transistor, may be formed on or over the substrate or entirely within the substrate or partly within and partly on or over the substrate, depending upon the nature of the device(s). Accordingly, as used herein with respect to the active device(s), the terms "in the substrate", "in the semiconductor substrate" and equivalents are intended to include all such variations.

FIG. 1 illustrates a semiconductor device 20 including a semiconductor substrate 21 having a front surface 22, at least one LDMOS transistor structure 23 arranged in the front surface 22, a conductive interconnection structure 24 arranged on the front surface 22 and one or more cavities 25 arranged in the front surface 22 of the semiconductor substrate 21.

The cavity 25 includes a base 26 and side walls 27 defined by the material of the semiconductor substrate 21 and a cap 28 which may include an insulating material. The semiconductor substrate 21 may include silicon and may include a silicon single crystal wafer. In some embodiments, the silicon single crystal substrate is highly resistive and has a bulk resistivity of greater than 100 Ohm·cm.

If the bulk resistivity of the semiconductor substrate is equal or greater than a predetermined level, parasitic inductor-substrate coupling and device parasitics can be reduced. The desirable predetermined level is usefully equal or greater than 100 Ohm·cm resistivity, conveniently equal or greater than about 500 Ohm·cm resistivity, more conveniently equal or greater than about 1000 Ohm·cm resistivity. As used herein, the term "bulk resistivity" refers to those portions of substrate that lie outside the doped device regions of the LDMOS transistor 23.

In other embodiments, the semiconductor substrate 21 is provided by an epitaxial silicon layer deposited on a substrate, such as a highly conductive silicon wafer.

The insulating material providing the cap 28 may form part of the conductive interconnection structure 24 such that an insulating layer of the conductive interconnection structure is arranged on the cavity 25 and seals a volume within the opening 29 provided by the base 26 and side walls 27 formed in the front surface 22 of the semiconductor wafer 20.

The opening 29 and, therefore, the cavity 25, may have various lateral shapes, such as square, rectangular, circular or hexagonal, or may be elongate or strip-like and may be a trench. The cavity 25 is arranged adjacent and spaced apart from the LDMOS transistor structure 23 by regions of the semiconductor substrate 21. The LDMOS transistor structure 23 is typically one of a plurality of transistor cells coupled in parallel forming an array which provides a single switch.

The conductive interconnection structure 24 may include one or more conductive layers 30, 31 which are spaced apart by one or more dielectric layers such as the insulation layer 28. The conductive layers 30, 31 may be electrically coupled by one or more conductive vias 32 which extend through the dielectric layer(s). For a LDMOS transistor structure 23, the conductive interconnection structure 24 may include a conductive redistribution structure for the drain, a conductive redistribution structure for the gate and a conductive redistribution structure for the source of the of the transistor structures. The conductive interconnection structure 24 may also include one or more contact pads 34 on an outermost surface.

In some embodiments, the semiconductor device 20 further includes a passive component 35 which is positioned above the cavity 25. The passive component 35 may be a resistor, an inductor or a capacitor, for example. In some embodiments, the passive component 35 is integrated into the conductive interconnection structure 24. For example, the passive component 35 may be a planar inductor in the form of a planar spiral conductive strip, as is illustrated in FIG. 1.

The cavity 25 may be filled by a material which has a dielectric constant which is lower than the dielectric constant of the insulating material providing insulation layer 28 and/or the dielectric constant of the material providing semiconductor substrate 21. In some embodiments, the cavity includes air or a vacuum. The cavity 25 may be used to decrease parasitic capacitance capacitive coupling between the passive component 35 and the semiconductor substrate 21.

In some embodiments, the cap 28 of the cavity 25 includes a semiconductor material or a metal in place of the insulation layer.

In some embodiments, the cavity 25 includes a plurality of trenches formed in the semiconductor substrate 21 which are coupled by a connecting or communicating cavity formed on the front surface 22. The connecting cavity may be defined by an insulating layer on the front surface 22 of the semiconductor substrate 21.

In some embodiments, the semiconductor device further includes at least one conductive via extending from the front surface to a rear surface of the semiconductor substrate. The conductive via may be coupled to a source of the LDMOS transistor.

The conductive via may include a first portion adjacent the rear surface that fills the via and a second portion on the first portion that lines side faces of the via and surrounds a gap. The gap may sealed by a dielectric layer to form a via cavity.

The conductive interconnection structure may include a metallization structure which is arranged on the LDMOS transistor structure. The metallization structure may include one or more dielectric layers, one or more conductive redistribution layers arranged between one or more dielectric layers and one or more conductive vias extending through one or more dielectric layers. In some embodiments, the metallization structure includes one or more cavities. At least one metallization cavity may be arranged in one or more dielectric layers of the metallization structure. The metallization cavity may be used to reduce parasitic capacitive coupling between the metallization structure and the substrate and/or between different portions of the metallization structure of the LDMOS transistor, for example between drain and gate, and source and gate.

In some embodiments, at least one metallization cavity is arranged adjacent opposing sides of a conductive drain runner. In some embodiments, at least one first metallization cavity may be arranged in a first dielectric layer and at least one second metallization cavity is arranged in a second dielectric layer such that the metallization cavities have an off-set stacked arrangement within the metallization structure.

The semiconductor device including one or more LDMOS transistors according to any one of the embodiments described herein may be used in a high frequency power amplifying circuit, such as RF power amplifying circuits for use in cellular communications, e.g. Doherty configurations, operating at frequencies in the range of 700 MHz to 3.6 GHz and power conversion in cellular communication networks. The high frequency amplifying circuit may be provided in the form of a monolithic microwave integrated circuit (MMIC).

Figure 2:
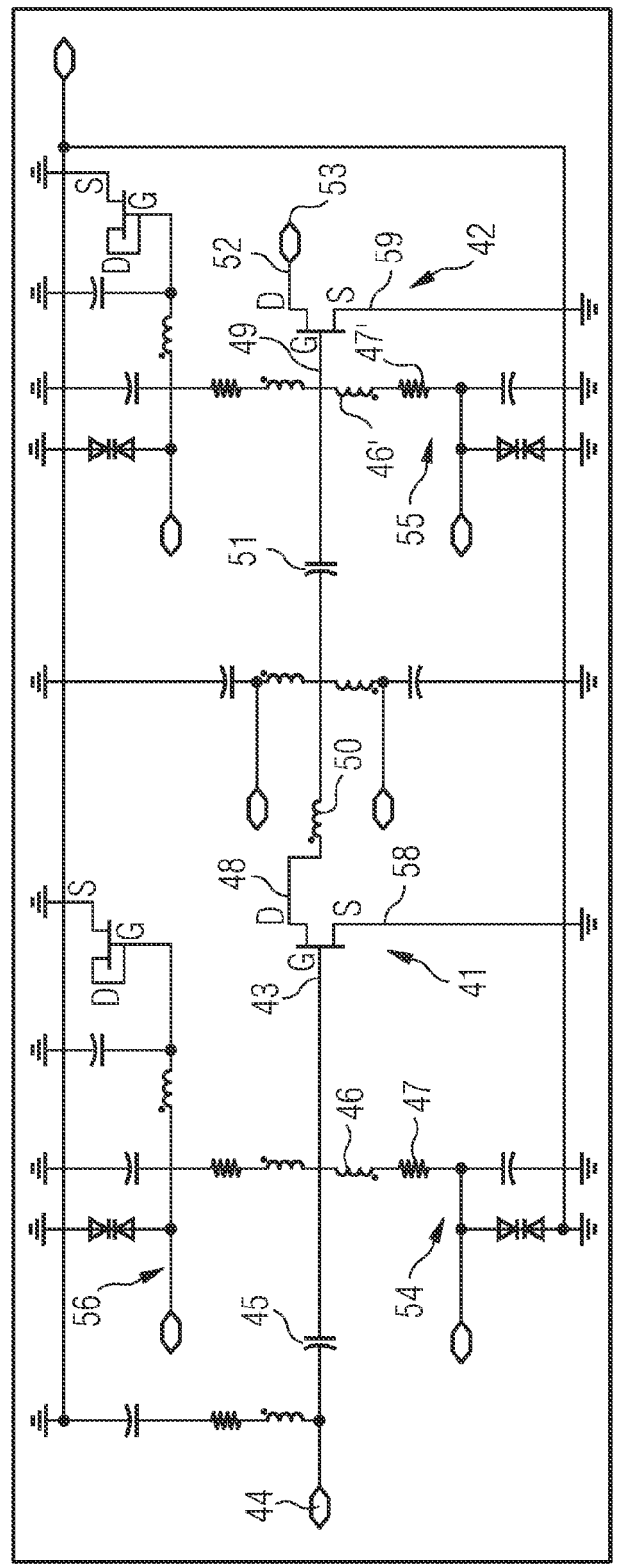
FIG. 2 illustrates a circuit diagram of a monolithic microwave integrated circuit (MMIC) including two LDMOS transistors.
Figure 3:
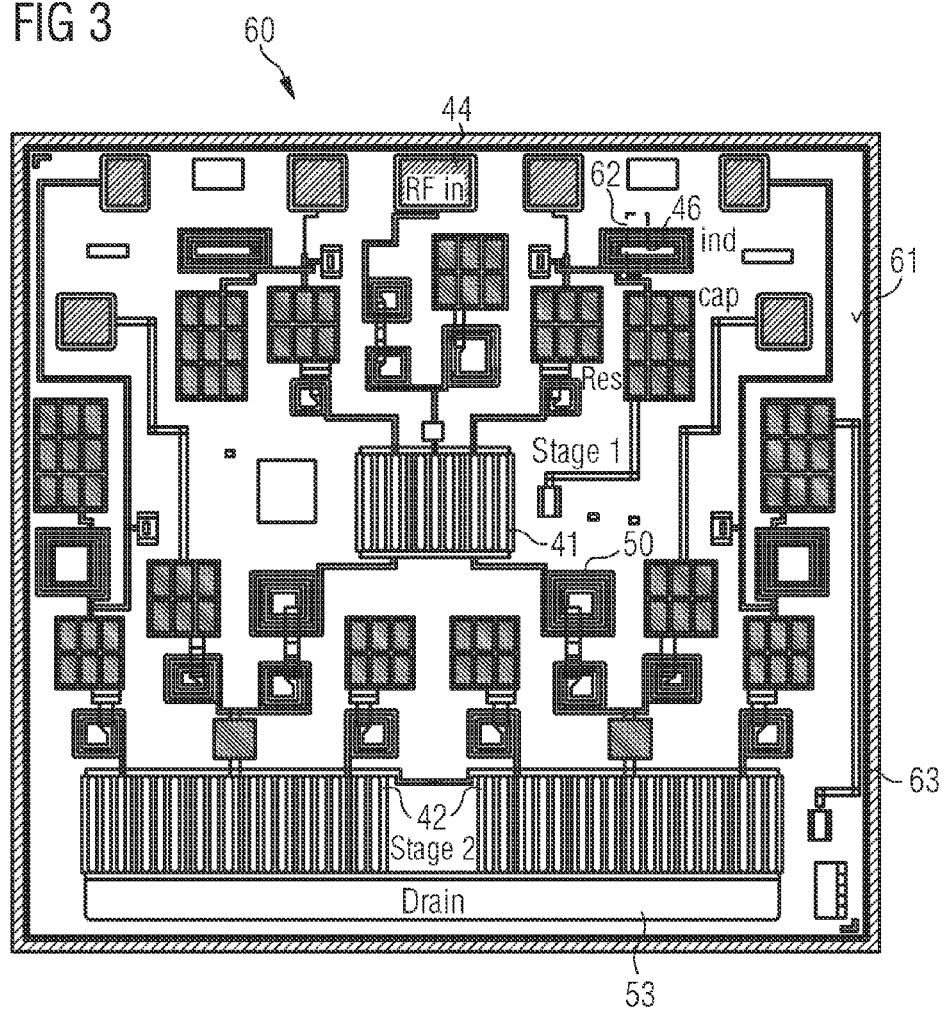
FIG. 3 illustrates a plan view monolithic microwave integrated circuit including two LDMOS transistors.

FIG. 2 illustrates a circuit diagram of an exemplary monolithic microwave integrated circuit (MMIC) 40 including one or more LDMOS transistors and FIG. 3 illustrates a top view of a monolithic microwave integrated circuit device which may include the circuit 40 illustrated in FIG. 2.

The monolithic microwave integrated circuit 40 includes two LDMOS transistors 41, 42 providing a first stage and second stage, respectively, of a RF amplifier circuit. Each LDMOS transistor 41, 42 includes a plurality of LDMOS transistor structures coupled in parallel to provide a single switch.

The gate 43 of the first LDMOS transistor 41 is coupled to the RF input terminal 44 of the circuit 40 via a serially coupled capacitor 45. A drain 48 of the first LDMOS transistor 41 is electrically coupled to the gate 49 of the second LDMOS transistor 42. An inductor 50 and capacitor 51 are serially coupled between the drain 48 of the first LDMOS transistor 41 and the gate 49 of the second LDMOS transistor 42. The drain 52 of the second LDMOS transistor 42 is coupled to an RF out terminal 53.

The circuit 40 includes an input matching circuit 54 coupled between the RF input terminal 44 and the gate 43 of the first LDMOS transistor 41 providing the first stage. The input matching circuit 54 comprises a T-branch coupled between the capacitor 45 and gate 43 and ground which includes an inductor 46, resistor 47 and a capacitor.

An input matching circuit 55 is coupled between the gate 49 of the second LDMOS transistor 42 providing the second stage of the amplifying circuit. The input matching circuit 54 comprises a T-branch coupled between the inductor 50 and capacitor 51 and ground which includes an inductor 46', resistor 47' and a capacitor.

A temperature compensation circuit 56, 57 is also provided for each amplifying stage. The source 58, 59 of the first LDMOS transistor 41 and of the second LDMOS transistor 42, respectively, is coupled to ground.

As can be seen in the plan view of the monolithic microwave integrated circuit device 60 of FIG. 3, the inductors 46, 46', 50 may each be provided by a planar coil which is monolithically integrated on the upper surface 61 of the semiconductor device 60.

One or more of the components of the monolithic microwave integrated circuit may be electrically coupled to the rear surface of the semiconductor substrate 63 and may be coupled to ground.

One or more cavities, indicated with the dashed lines 62, may be arranged under one, some or all of the inductors 46, 46', 50 and extend from the upper surface 61 of the semiconductor device 60 into the body of semiconductor substrate 63 of the semiconductor device 60 in the direction of the opposing rear surface. The cavity 62 may include a base and sidewalls defined by the semiconductor substrate 63 and be capped to form a sealed cavity by a further material which may including insulating material, such as an oxide or nitride, semiconductor material, such as a layer of polysilicon, or a metal or alloy.

Each of the cavities 62 may include a material having a dielectric constant which is lower than the dielectric constant of the semiconductor substrate, for example silicon, and/or lower than the dielectric constant of insulating material providing additional insulation and passivation layers on the front surface 61 of the semiconductor device 60. In some embodiments, the cavity may include a vacuum or air.

The cavity 62 may be formed in the front surface 61 of the semiconductor substrate 63 after processing of the semiconductor substrate to form one or more LDMOS transistor structures, such as the LDMOS transistors 41, 42 providing the first stage and second stage amplifiers of the monolithic microwave integrated circuit 40.

An opening or blind via may be formed in the upper surface 61 of the substrate 63 and the opening covered with a first layer to form an enclosed cavity defined by the material of the semiconductor substrate and/or first layer. The opening may be formed by etching, for example wet etching or plasma etching, after applying a mask to cover regions of the front surface which are to remain unetched.

In some embodiments, the formation of one or more cavities 62 in the semiconductor substrate 63 may be performed at the same time as the fabrication of one or more further structures of the monolithic microwave integrated circuit 40, for example conductive through substrate vias (TSV). This may be useful in reducing the number of processing steps.

Figure 4:
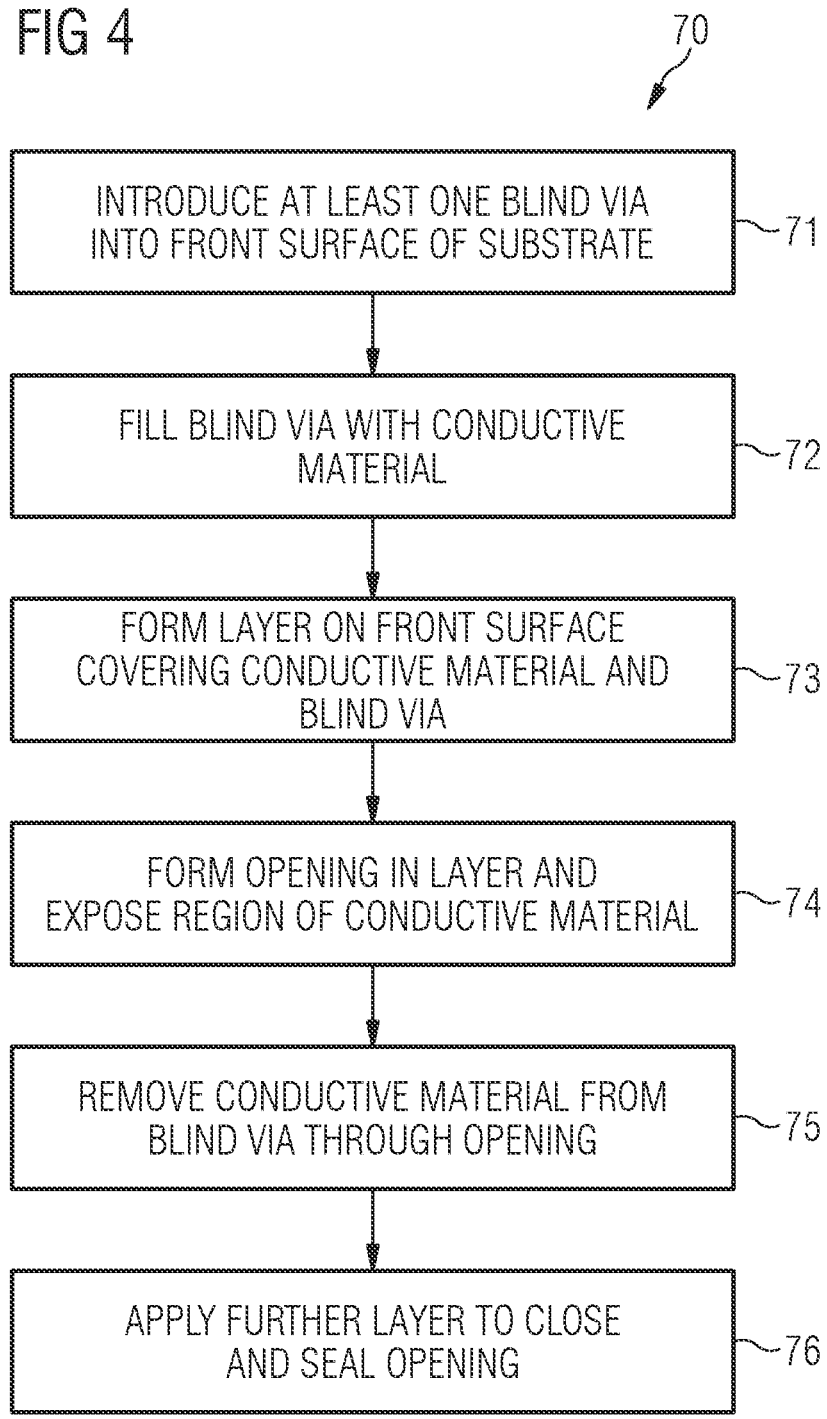
FIG. 4 illustrates a flowchart of a method for forming a cavity in a semiconductor substrate.

FIG. 4 illustrates a flowchart 70 of a method for fabricating a cavity in a semiconductor substrate including one or more LDMOS structures. In box 71, at least one blind via is introduced into the front surface of a semiconductor substrate including one or more LDMOS structures. In box 72, the blind via is filled with a conductive material. In box 73, a layer is formed on the front surface covering the conductive material and the blind via. The layer may include an insulating material or a dielectric material or a semiconductor material or a metal. In box 74, an opening is formed in the layer to expose a region of the conductive material within the blind via. In box 75, the conductive material is removed from the blind via through the opening. In box 76, a further layer is applied onto the layer on the front surface to close and seal the opening and to form an enclosed and sealed cavity within the blind via.

This method may be carried out at the same time as the formation of one or more conductive through substrate vias (TSV) within the semiconductor substrate. This may be useful in reducing the number of masking, deposition and etching steps for example.

The one or more conductive through substrate vias may be coupled to one of the LDMOS transistor structures and/or a further component of the monolithic microwave integrated circuit, such as a capacitor or inductor and may provide an electrical connection to the rear surface of the substrate. The one or more conductive through substrate vias may provide an electrical connection to ground.

Figure 5:
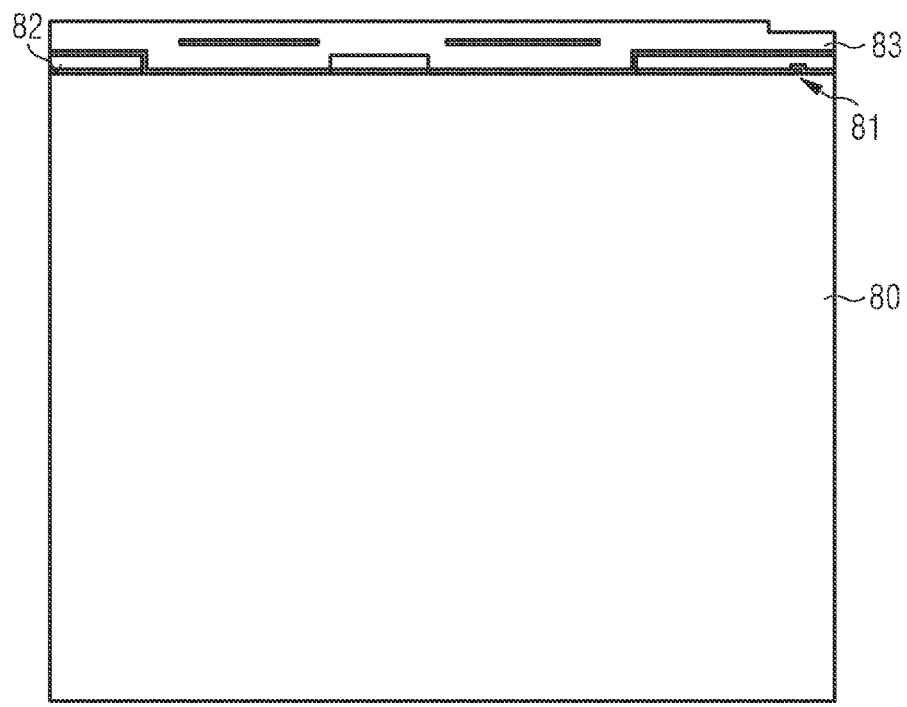
FIG. 5 illustrates a semiconductor substrate including a LDMOS transistor structure.

FIG. 5 illustrates a cross-sectional view of a semiconductor substrate 80 including at least one LDMOS transistor device 81 formed in a front surface 82 of the semiconductor substrate 80. The semiconductor substrate 80 may be a silicon single crystal wafer having a bulk resistivity of greater than 100 Ohm·cm. In some embodiments, the semiconductor substrate 80 includes a highly doped silicon wafer and an epitaxially deposited silicon layer on the highly doped silicon wafer. The semiconductor substrate 80 further includes one or more passivation and/or insulating layers 83 arranged on the front surface 82.

Figure 6:
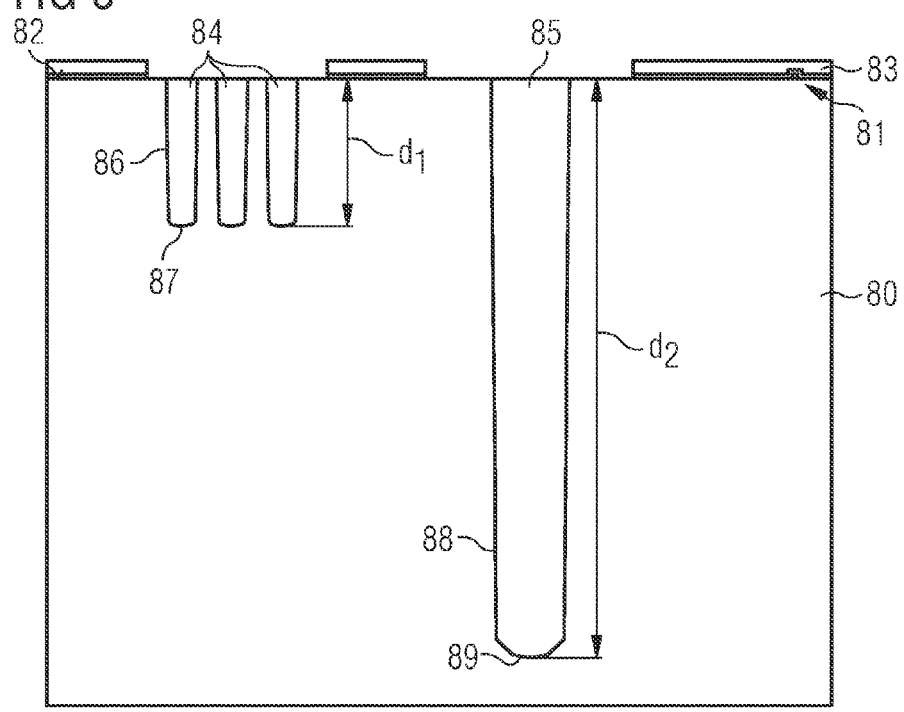
FIG. 6 illustrates the semiconductor substrate of FIG. 5 after the introduction of first and second blind vias in the semiconductor substrate.

FIG. 6 illustrates the introduction of one or more first blind vias 84 into the front surface 82 of the substrate 80 at a position adjacent the LDMOS structure 81. Portions of the passivation and insulating layers 83 are removed from regions of the front surface 82 in which the blind vias 84 are to be formed. The remaining portions of the passivation and insulating layers 83 may act as a mask and cover the LDMOS transistor device 81.

The one or more first blind vias 84 may be arranged at a position underneath which a further component, such as an inductor, is to be formed on the front surface 82. The one or more first blind vias 84 may have a depth $d_1$ and a cross-sectional area $a_1$. The first blind via 84 may be introduced by forming a structured mask on the front surface 82 and removing the material of the semiconductor substrate 83 in the openings in the mask, for example by an etching technique, such as plasma etching.

In some embodiments, one or more second blind vias 85 may be formed in the front surface 82 using the same mask and etching process as the first blind vias 84. In the drawings the illustrated second blind via 85 is one of a row of blind vias extending into the plane of the drawing. The second blind vias 85 may have a depth $d_2$ and a cross-sectional area $a_2$, whereby the depth $d_2$ is greater than $d_1$. The second blind vias 85 may be used for forming a portion of a redistribution structure coupling a component arranged on the front surface 82 of the semiconductor substrate 80 to the rear surface of the substrate 80. For example, the second blind vias 85 may be used to fabricate a conductive through substrate via which electrically couples an intrinsic electrode, such as intrinsic source of the LDMOS transistor device 81, to the rear surface of the substrate 80.

The first blind vias 84 are each defined by sidewalls 86 and a base 87 formed from the semiconductor material of the semiconductor substrate 80. The second blind vias 85 are similarly defined by sidewalls 88 and base 89 formed from the semiconductor material of the semiconductor substrate 80.

The lateral form of the first blind vias 84 and the second blind via 85 may be substantially square, circular, hexagonal or elongate, for example substantially rectangular or oval.

In some embodiments, the depth $d_2$ of the second blind vias 85 is greater than three times the depth $d_1$ of the first blind vias 84. The relationship between the depths $d_1$ and $d_2$ may be defined by suitable selection of the cross-sectional area $a_1$ of the first blind vias 84 and the cross-sectional area $a_2$ of the second blind vias 85 and/or by suitable selection of the shape of the cross-sectional areas. As an example, the first blind vias 84 may have a substantially rectangular shape with a larger ratio of 3:1 to 10:1, for example, than the second blind vias 85 so that the etching depth of the first blind vias 84 is less than that of the second blind vias 85 when using the same etch conditions.

FIG. 7 illustrates the semiconductor substrate 80 after the deposition of a conductive layer 90 onto the front surface 82 of the semiconductor substrate 80, into the first blind vias 84 and into the second blind via 85. The conductive layer 90 may cover the portions of the passivation and insulating layers 83 arranged on the front surface 82. In some embodiments, the first blind vias 84 may be substantially filled with the conductive material, whereas the sidewalls 88 and base 89 of the second blind via 85 are coated such that a gap 91 is formed in at least an upper portion of the second blind via 85.

The conductive layer 90 may include one or more metals and may include high purity copper, for example, which may be deposited using electro-deposition techniques. In some embodiments, the conductive layer 90 includes one or two or more sublayers, for example, one or more adhesion layers or diffusion barrier layers which are first deposited onto the front surface 82 and onto the sidewalls 86 and base 87 of the first blind vias 84 and onto the sidewalls 88 and base 89 of the second blind via 85 before deposition of one or more further metallic layers which provide the majority of the electrical connection. The one or more adhesion and diffusion barrier layers may be deposited using sputtering. In some embodiments, a seed layer may also be deposited by sputtering onto which the thickest sublayer of the conductive layer 90 is electrodeposited.

In some embodiments, the electrodeposition of the conductive layer 90 or sublayer of conductive layer 90 may be carried out using a two stage process. In the first stage, the deposition conditions and/or composition of the electroplating bath are selected such that growth of the conductive layer 90 in directions perpendicular to the front surface 82 of the substrate 80 is favoured and in directions parallel to the front surface 82 is suppressed. This may result in the conductive material substantially filling the base portion of the second blind via 85 and substantially filling the first blind vias 84. In the second stage, the composition of the electroplating bath and/or the electro-deposition conditions may be adjusted in order to favour lateral growth and suppress vertical growth with respect to the front surface 82 in order to substantially conformally deposit a conductive sublayer layer over the sidewalls 88 of the second blind via 85 and on the front surface 82 of the substrate 80.

The two stage process may result in two conductive subparts which are discernible by differing microstructures, for example average grain size. The first subpart which fills the base portion of the second blind via 85 may have a larger grain size than the second subpart which is positioned on the periphery of the first subpart and which lines the side walls 88 of the second blind via 85. The second subpart surrounds a gap 91 in the upper portion of the second blind via 85.

FIG. 8 illustrates the semiconductor substrate 80 after the introduction of a sacrificial material 92 into the gap 91 formed in the upper portion of the second blind via 85 and after a planarization process has been carried out to the front surface of the semiconductor substrate 80 such that the conductive layer 90 is removed from portions of the insulating layer 83 and fills intervening portions of the insulating layer 83 on the front surface 82, for example above and adjacent the first blind vias 84 and adjacent the second blind via 85.

FIG. 9 illustrates the disposition of a further insulating layer 93 onto the insulating layer 83 and conductive layer 90. The further insulating layer 93 may line the gap 91 formed in the upper portion of the second blind via 85 and may cover the oxide layer and conductive layer 90 arranged on the front surface 82 of the substrate 80. A second insulating layer 94 is arranged on the first insulating layer 93. The second insulating layer 94 may cover the gap 91 such that a cavity or void 95 is formed within the upper portion of the second blind via 85. The first insulating layer 93 may include a nitride such as silicon nitride and the second insulating layer 94 may include an oxide, for example.

FIG. 10 illustrates the formation of openings 96 in the insulating layers 93, 94 which are positioned above the first blind vias 84 such that a portion of the conductive layer 90 forms the base of the openings 96. The insulation layers 93, 94 provide a mask during the subsequent removal of the conductive material arranged within the first blind vias 84 and a portion of the conductive layer 90 arranged on the first blind vias 84.

FIG. 11 illustrates the semiconductor substrate 80 after the removal of the conductive material from the first blind vias 84 through the openings 96 and after the subsequent deposition of a further insulating layer 97 onto the insulation layer 94. The further insulating layer 97 covers the openings 96 such that a sealed and enclosed cavity 98 or void is formed from the first blind vias 84, a connecting cavity 99 formed after the removal of the conductive layer 90 arranged on the front surface 82 of the semiconductor substrate 80 and the openings 96.

A passive component 100, such as an inductor, is arranged on the insulating layer 97 above the cavity 98. The passive component 100 may be monolithically integrated into the device provided by the semiconductor substrate 80. In some embodiments, the component 100 may be a planar inductor formed by a planar spiral arranged on the insulating layer 97. In some embodiments, the component 183 is formed based on a damascene approach and thus becomes integrated in the insulating layer 97. The cavity 98 includes a dielectric constant which is lower than a dielectric constant of the semiconductor substrate 80 and of the insulating layers 93, 94, 97 defining the cavity 98. The cavity 98 may include a vacuum or air, for example. The cavity 98 may be used to reduce parasitic coupling between the passive component 100 and the semiconductor substrate 80.

During subsequent processing steps, a metallization structure may be formed on the front surface 82 of the substrate 84, for example above the LDMOS transistor device 81. The insulating layers 93, 94, 97 and the formation of the passive component 100 may be formed using some or all of the processing stages used to form the metallization structure. The metallization structure may be electrically coupled with the passive component 100 and further planar interconnection structures and further components such as resistors and capacitors to form a monolithic microwave integrated circuit.

FIG. 12 illustrates the semiconductor substrate 80' after the subsequent working of the rear surface 101 to remove material such that a portion of the conductive material of the conductive layer 90 arranged at the base of the second blind via 85 is exposed in the rear surface 101 and such that a conductive through substrate via (TSV) 104 is formed which extends through thickness of the substrate 80 from the front surface 82 to the rear surface 101. The conductive through substrate via 104 may be coupled to the intrinsic source of the LDMOS transistor.

One or more metallic layers 103 may be applied to the rear surface to form a ground and to allow the soldering of the semiconductor substrate 80' onto another surface, for example a metallic flange.

Figure 13:
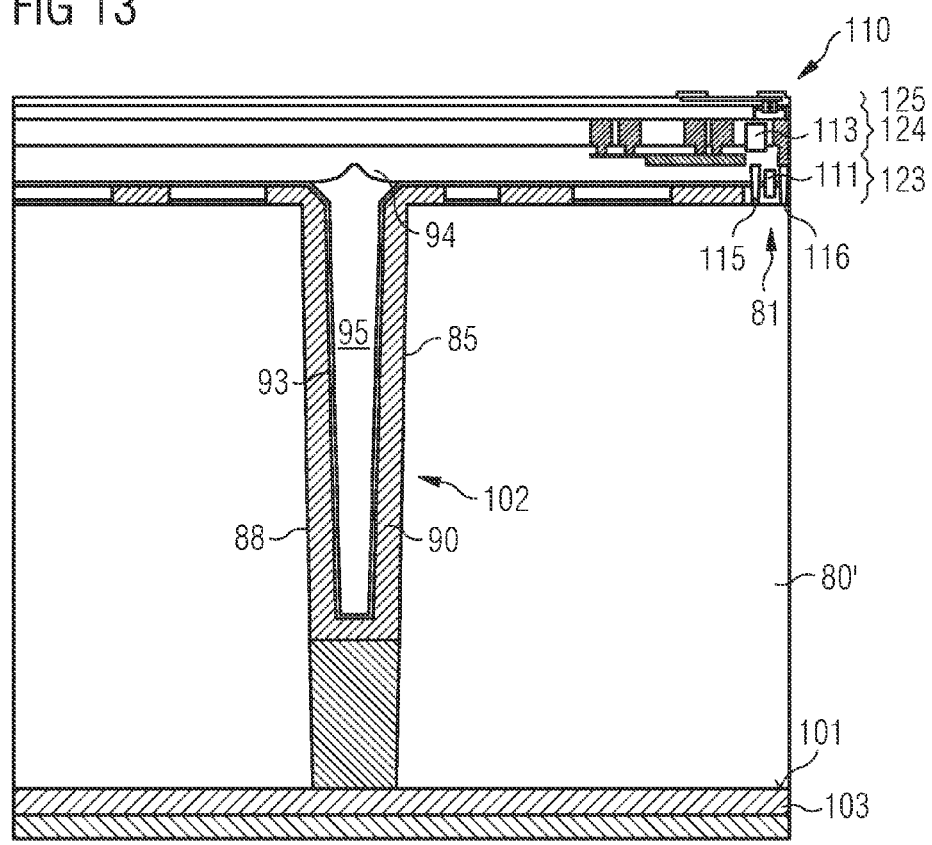
FIG. 13 illustrates the semiconductor device after further processing to form metallization structure on the front surface and a conductive though substrate via (TSV).
Figure 14:
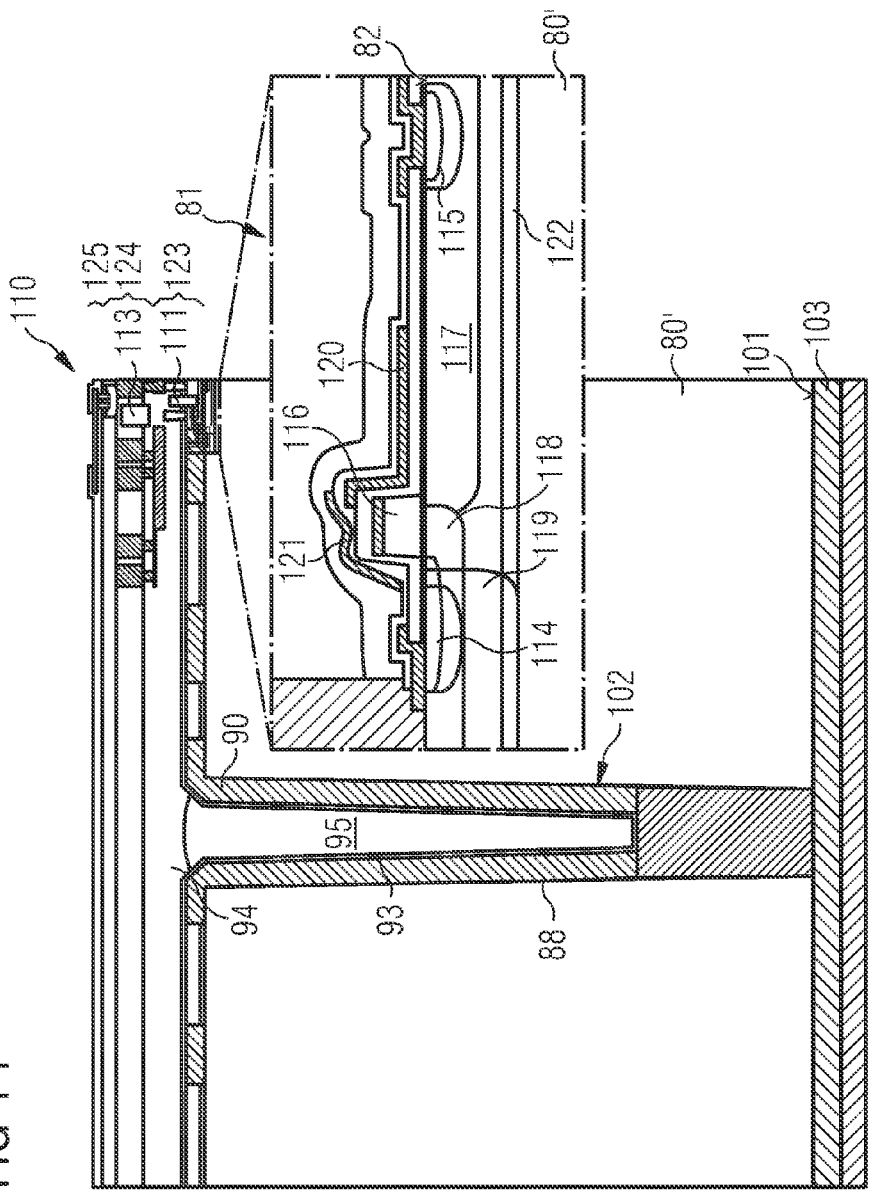
FIG. 14 illustrates an enlarged view of the LDMOS transistor structure of FIG. 13.
Figure 15:
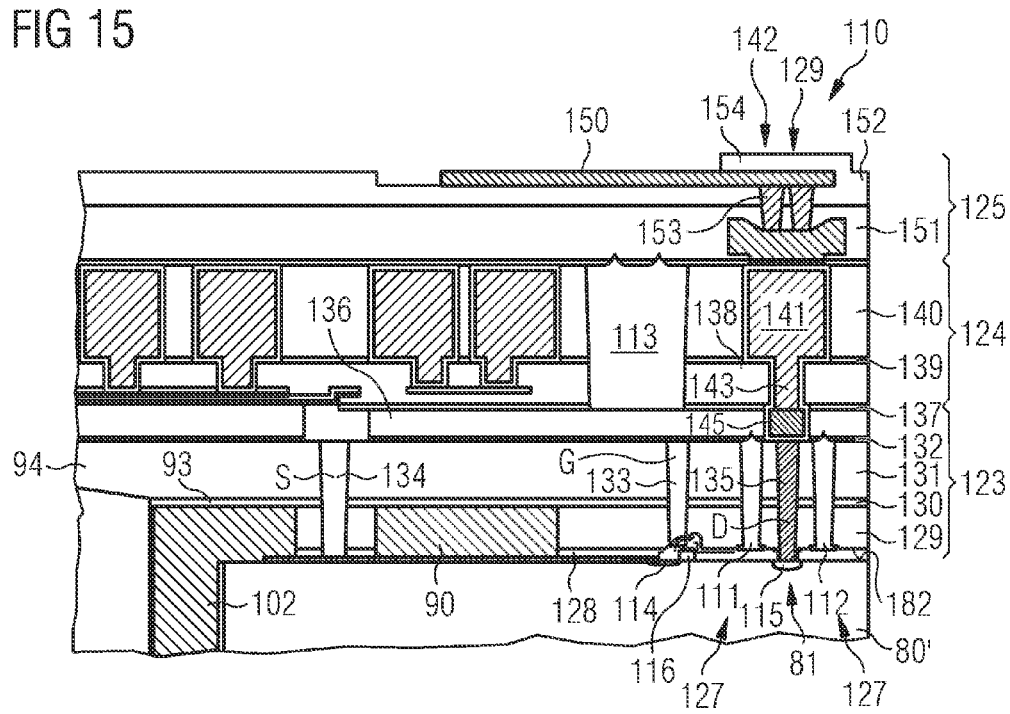
FIG. 15 illustrates an enlarged view of the metallization structure of FIG. 13.

FIG. 13 illustrates a view of the metallization structure 110 of the LDMOS transistor 81, cavities 111, 112, 113 within the metallization structure 110 and the conductive through substrate via 102. FIG. 14 illustrates an enlarged view of the LDMOS transistor 81. FIG. 15 illustrates an enlarged view of the metallization structure 110 and cavities 111, 112, 113.

The LDMOS transistor 81 includes a highly doped source region 114, a highly doped drain region 115 and a gate 116 arranged laterally between the highly doped source region 114 and highly doped drain region 115. The LDMOS transistor 81 also includes a doped drift region 117 which extends from the front surface 82 into the substrate 80 from the gate 116 to the highly doped drain region 115, a doped channel region 118 which extends from the front surface 82 into the substrate 80 and from gate to the highly doped source region 114 and a doped body contact region 119. The doped body contact region 119 extends further into the substrate 80 from the front surface 82 than the doped channel region 118.

The highly doped source region 114, the highly doped drain region 115 and the drift zone 117 have a first conductivity type, for example n-type, which opposes the conductivity type of the substrate 80 which may be p-type, for example. The channel region 118 and the body contact region 119 have a second conductivity, for example p-type, which opposes the first conductivity type. The body contact region 119 may be more highly doped that the channel region 118.

The LDMOS transistor 81 also includes a field plate 120 which extends from the gate 116 in the direction of the highly doped drain region 115 and a gate shield 121 which extends from the gate 116 in the direction of the highly doped source region 114. The LDMOS transistor 81 also includes a doped buried layer 122 coupled to the body contact region 119 which extends throughout the lateral area of the LDMOS transistor structure. The doped buried layer 122 is spaced apart and at a distance from the front surface 82 and rear surface 102 of the substrate 80 and along with the field plate 120 and drift region 117 forms part of a RESURF structure for the LDMOS transistor 81. The doped buried layer 122 may have a doping concentration which is greater than the doping concentration of the channel region 118 and less than that of the body contact region 119.

In this embodiment, the metallization structure 110 includes three levels 123, 124, 125 and provides a conducting path from the highly doped source region 114, highly doped drain region 115 and gate 116 to a respective contact pad at the upper surface.

The cavities 111, 112 are arranged in the first metallization level 123 adjacent opposing sides of a drain connection stack 129 that is positioned between two neighbouring LDMOS transistor structures 127. The cavity 113 is arranged in the second metallization level 124 adjacent the drain connection stack. A further cavity, which cannot be seen in the view of FIG. 15, is arranged adjacent the opposing side of the drain connection stack 129 in the second metallization level 124. The illustrated cavities 111, 112, 113 are in each case one of a row of cavities which extends into the plane of the drawing.

The first level of metallization 123 includes a stack of four dielectric layers including a $SiO_2$ layer 128 arranged on the front surface 82, a BPSG layer 129 arranged on the $SiO_2$ layer 128, a silicon nitride layer 130 arranged on the BPSG layer 129, a $SiO_x$ layer 131 arranged on silicon nitride layer 130 and a further silicon nitride layer 132 arranged on the $SiO_x$ layer 131.

Vias are formed through this multilayer dielectric stack to provide a conductive via 135 arranged on and coupled to the highly doped drain region 115, a conductive via 133 which is coupled to the gate and a conductive via 134 which is coupled to the highly doped source region 114. The electrical contact between the conductive via 133 and the gate 116 takes place outside of the plane illustrated in the drawings.

The cavities 111, 112 are positioned adjacent opposing side faces of the conductive via 135 which is coupled to the highly doped drain region 115. The cavities 111, 112, are positioned between the highly doped drain region 115 and the gate 116 of adjacent LDMOS transistor cells 127.

The second metallization level 124 may include a stack of dielectric layers including a SiO₂ layer 136 arranged on the silicon nitride layer 132, silicon nitride layer 137 arranged on the SiO₂ layer 136, a SiO₂ layer 138 arranged on the silicon nitride layer 137, a silicon nitride layer 139 arranged on the SiO₂ layer 138 and a SiO₂ layer 140 arranged on the silicon nitride layer 139.

The second metallization level 124 includes metal via portions 143 which extend through the silicon nitride layer 137 and SiO₂ layer 138. The second metallization level 124 further includes a conductive redistribution structure 141 which extends through the silicon nitride layer 139 and SiO₂ layer 140. In the case of the metallization structure 142 for the drain contact, a plurality of conductive vias 143 may be provided which are arranged spaced at intervals along the length of the underlying drain runner 145.

A cavity 113 is formed adjacent opposing sides of the vias 143 of the metallization structure 142 for the drain contact in the second metallization level 124. In some embodiments, the drain sided edge of one row of the cavities 113 may be positioned above the gate.

The third metallization level 125 provides a conductive structure between the drain metal stack 142 and an outer contact pad 150. The third metallization level 124 may include one or more dielectric layers 151, 152, a metal contact 153 extending through the dielectric layers 151 and 152 and one or more through contacts 153. The contact pad 150 may also be defined on the upper surface by depositing a further nitride layer 154 which may overlap some or all peripheral regions of the metal contact pad 150.

In some embodiments, cavities 111, 112, 113 are arranged within differing levels 123, 124 of the multilevel metallization structure 110 and have an off-set stacked arrangement. However, cavities may be arranged in only one of the metallization layers or more than one of the metallization layers.

The position of the cavities may be selected such that a localised region of the dielectric material of the metallization structure is provided with a lower dielectric constant at positions within the metallization structure suitable for reducing the maximum electric field at that position and for reducing capacitive coupling between two or more separate conductive portions of the redistribution structures provided by the metallization structure, for example, between the source distribution structure and the drain redistribution structure.

The highly doped source region 114 of the LDMOS transistor 81 may be electrically coupled to a rear surface 102 of the substrate 80 by one or more conductive through substrate vias 102 arranged adjacent the LDMOS transistor 181 and, in some embodiments, between highly doped source regions 114 of neighbouring LDMOS transistor cells or segments 127.

The conductive through substrate via 102 may be fabricated after the fabrication of the LDMOS transistor 181 and before the metallization structure 110 is applied to the front surface 82.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor substrate comprising a front surface;
    an LDMOS transistor structure in the front surface;
    a conductive interconnection structure arranged on the front surface; and
    a cavity arranged in the front surface, the cavity comprising a base and side walls defined by the semiconductor substrate.

2. The semiconductor device of claim 1, further comprising a cap covering the cavity, the cap comprising at least one of an insulating material, a semiconductor material and a metal.

3. The semiconductor device of claim 1, wherein the cavity is arranged in a region of the semiconductor substrate underneath a passive component arranged on the front surface.

4. The semiconductor device of claim 3, wherein the passive component is integrated in the conductive interconnection structure.

5. The semiconductor device of claim 3, wherein the passive component comprises an inductor, a resistor or a capacitor.

6. The semiconductor device of claim 3, wherein the passive component is a planar inductor.

7. The semiconductor device of claim 1, wherein the cavity comprises a plurality of trenches formed in the semiconductor substrate coupled by a connecting cavity formed on the front surface.

8. The semiconductor device of claim 1, further comprising a conductive via extending from the front surface to a rear surface of the semiconductor substrate, the conductive via being coupled to a source of the LDMOS transistor structure.

9. The semiconductor device of claim 8, wherein the conductive via comprises a first conductive portion adjacent the rear surface that fills the via and a second conductive portion on the first conductive portion that lines side faces of the via and surrounds a gap.

10. The semiconductor device of claim 9, wherein the gap is sealed by one or more dielectric layers to form a via cavity.

11. A monolithic microwave integrated circuit, comprising:
   a semiconductor substrate comprising a front surface;
   an LDMOS transistor structure in the front surface;
   a capacitor monolithically arranged on the front surface of the semiconductor substrate;
   an inductor monolithically arranged on the front surface;
   a planar interconnection structure arranged on the front surface and coupling the LDMOS structure device, the capacitor and the inductor so as to form the monolithic microwave integrated circuit; and
   a cavity arranged in the semiconductor substrate underneath at least one of the capacitor and the inductor.

12. The monolithic microwave integrated circuit of claim 11, further comprising at least one conductive through substrate via coupling at least one of a source of the LDMOS transistor structure, the capacitor and the inductor to a rear surface of the semiconductor substrate.

13. The monolithic microwave integrated circuit of claim 11, wherein the inductor is a planar inductor provided by a portion of the planar interconnection structure.

14. The monolithic microwave integrated circuit of claim 11, wherein the cavity comprises a plurality of trenches formed in the semiconductor substrate and coupled together by a connecting cavity formed on the front surface.

15. The monolithic microwave integrated circuit of claim 11, wherein a first array of LDMOS transistor structures provides a first amplifier stage and a second array of LDMOS transistor structures provides a second amplifier stage, and wherein the inductor is coupled to a gate of the first amplifier stage.

16. A semiconductor device, comprising:
   a semiconductor substrate comprising a front surface;
   an LDMOS transistor structure in the front surface;
   a conductive interconnection structure arranged on the front surface; and
   a cavity arranged in the front surface,
   wherein the cavity is arranged in a region of the semiconductor substrate underneath a passive component arranged on the front surface,
   wherein the passive component is a planar inductor.

17. A semiconductor device, comprising:
   a semiconductor substrate comprising a front surface;
   an LDMOS transistor structure in the front surface;
   a conductive interconnection structure arranged on the front surface;
   a cavity arranged in the front surface; and
   a conductive via extending from the front surface to a rear surface of the semiconductor substrate, the conductive via being coupled to a source of the LDMOS transistor structure.

18. The semiconductor device of claim 17, wherein the conductive via comprises a first conductive portion adjacent the rear surface that fills the via and a second conductive portion on the first conductive portion that lines side faces of the via and surrounds a gap.

19. The semiconductor device of claim 18, wherein the gap is sealed by one or more dielectric layers to form a via cavity.

20. The semiconductor device of claim 17, wherein the cavity is arranged in a region of the semiconductor substrate underneath a passive component arranged on the front surface, and wherein the passive component is a planar inductor.

* * * * *